(12) United States Patent
Ice (10) Patent No.: US 7,371,965 B2
(45) Date of Patent: May 13, 2008

(54) MODULAR CAGE WITH HEAT SINK FOR USE WITH PLUGGABLE MODULE

(75) Inventor: Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 586 days.

(21) Appl. No.: 10/434,928

(22) Filed: May 9, 2003

(65) Prior Publication Data

US 2004/0027816 A1 Feb. 12, 2004

Related U.S. Application Data

(60) Provisional application No. 60/425,643, filed on Nov. 12, 2002, provisional application No. 60/379,436, filed on May 9, 2002.

(51) Int. Cl.
  *H02G 3/08* (2006.01)
  *H02K 7/14* (2006.01)
(52) U.S. Cl. .................. 174/50; 174/520; 174/548; 361/688; 361/703; 361/709
(58) Field of Classification Search .................. 174/50, 174/16.3, 54, 50.54, 52.5, 52.1, 50.51, 50.52, 174/520, 548, 547, 559, 17 CT, 17 R; 439/352, 439/357, 610, 939, 954, 571, 607; 361/704, 361/709, 715, 720, 600, 601, 710, 702, 676, 361/683, 687, 688, 703, 797; 385/92, 14
See application file for complete search history.

(56) References Cited

U.S. PATENT DOCUMENTS 4,083,619 A  4/1978  McCormick et al.

(Continued)

FOREIGN PATENT DOCUMENTS

DE  200 05 316 U1  9/2000

(Continued)

OTHER PUBLICATIONS

*Fiber Optic Module Interface Attachment*, Research Disclosure, Kenneth Mason Publications Ltd., England, No. 330, Oct. 1991.

(Continued)

*Primary Examiner*—Angel R. Estrada
(74) *Attorney, Agent, or Firm*—Workman Nydegger (57) ABSTRACT

A heat sink and module cage assembly for receiving a pluggable electronics component, such as an opto-electronic transceiver module. The heat sink is attached to the module cage and includes a bottom surface forming one of four sidewalls of a chamber that receives the electronics component. The attachment of the heat sink in this manner enables the heat sink and module cage to be assembled during fabrication and prior to the assembly being shipped to a third party who may use the assembly on a printed circuit board. The top surface of the heat sink defines a plane that enables the assembly to be press fitted onto the printed circuit board using a flat rock tool. The sidewall of the cage assembly opposite the bottom surface of the heat sink includes leaf springs that bias the electronics module against the heat sink, thereby facilitating heat transfer to the heat sink.

24 Claims, 5 Drawing Sheets

U.S. PATENT DOCUMENTS

| | | | |
|---|---|---|---|
| 4,387,956 A | 6/1983 | Cline | |
| 4,678,264 A | 7/1987 | Bowen et al. | |
| 4,798,430 A | 1/1989 | Johnson et al. | |
| 4,899,256 A * | 2/1990 | Sway-Tin | 361/715 |
| 4,993,803 A | 2/1991 | Saverison et al. | |
| 5,039,194 A | 8/1991 | Block et al. | |
| 5,069,522 A | 12/1991 | Block et al. | |
| 5,071,219 A | 12/1991 | Yurtin et al. | |
| 5,195,897 A | 3/1993 | Kent et al. | |
| 5,202,943 A | 4/1993 | Carden et al. | |
| 5,256,080 A | 10/1993 | Bright | |
| 5,329,428 A | 7/1994 | Block et al. | |
| 5,416,871 A | 5/1995 | Takahashi et al. | |
| 5,487,678 A | 1/1996 | Tsuji et al. | |
| 5,528,408 A | 6/1996 | McGinley et al. | |
| 5,546,281 A | 8/1996 | Poplawski et al. | |
| 5,561,727 A | 10/1996 | Akita et al. | |
| 5,596,665 A | 1/1997 | Kurashima et al. | |
| 5,734,558 A | 3/1998 | Poplawski et al. | |
| 5,767,999 A | 6/1998 | Kayner | |
| 5,820,398 A | 10/1998 | Stabroth et al. | |
| 5,879,173 A | 3/1999 | Poplawski et al. | |
| 5,901,263 A | 5/1999 | Gaio et al. | |
| 5,931,290 A | 8/1999 | Wehrli, III et al. | |
| 5,947,435 A | 9/1999 | Small | |
| 5,980,324 A | 11/1999 | Berg et al. | |
| 6,050,658 A | 4/2000 | O'Sullivan et al. | |
| 6,055,158 A * | 4/2000 | Pavlovic | 174/16.3 |
| 6,069,991 A | 5/2000 | Hibbs-Brenner et al. | |
| 6,074,228 A | 6/2000 | Berg et al. | |
| 6,081,431 A | 6/2000 | Lemke | |
| 6,088,498 A | 7/2000 | Hibbs-Brenner et al. | |
| 6,142,802 A | 11/2000 | Berg et al. | |
| 6,142,828 A | 11/2000 | Pepe | |
| 6,149,465 A | 11/2000 | Berg et al. | |
| 6,169,295 B1 | 1/2001 | Koo | |
| 6,229,708 B1 | 5/2001 | Corbin, Jr. et al. | |
| 6,231,145 B1 | 5/2001 | Lin | |
| 6,259,769 B1 | 7/2001 | Page et al. | |
| 6,430,053 B1 | 8/2002 | Peterson et al. | |
| 6,434,015 B1 | 8/2002 | Hwang | |
| 6,439,918 B1 | 8/2002 | Togami et al. | |
| 6,494,623 B1 | 12/2002 | Ahrens et al. | |
| 6,517,382 B2 | 2/2003 | Flickinger et al. | |
| 6,524,134 B2 | 2/2003 | Flickinger et al. | |
| 6,532,155 B2 | 3/2003 | Green et al. | |
| 6,533,603 B1 | 3/2003 | Togami | |
| 6,538,882 B2 | 3/2003 | Branch et al. | |
| 6,544,055 B1 | 4/2003 | Branch et al. | |
| 6,556,445 B2 | 4/2003 | Medina | |
| 6,570,768 B2 | 5/2003 | Medina | |
| 6,573,616 B2 * | 6/2003 | Yamane | 361/703 |
| 6,788,540 B2 * | 9/2004 | Kruger et al. | 174/16.3 |
| 6,980,437 B2 * | 12/2005 | Bright | 361/715 |
| 7,120,024 B2 * | 10/2006 | Watanabe et al. | 174/16.3 |
| 7,145,773 B2 * | 12/2006 | Shearman et al. | 361/715 |
| 2002/0142649 A1 | 10/2002 | Baugh et al. | |
| 2002/0150343 A1 | 10/2002 | Chiu et al. | |
| 2003/0020986 A1 | 1/2003 | Pang et al. | |
| 2003/0044129 A1 | 3/2003 | Ahrens et al. | |
| 2003/0059167 A1 | 3/2003 | Chiu et al. | |
| 2003/0100204 A1 | 5/2003 | Hwang | |

FOREIGN PATENT DOCUMENTS

| | | |
|---|---|---|
| EP | 0 442 608 A2 | 8/1991 |
| EP | 0 456 298 A1 | 11/1991 |
| GB | 2 297 007 A | 7/1996 |
| JP | 4-165312 | 6/1992 |

OTHER PUBLICATIONS

T.R. Block et al., *Field Replaceable Optical Link Card*, IBM Technical Disclosure Bulletin, vol. 37, No. 02B, Feb. 1994.

Ronald L. Soderstrom et al., *CD Laser Optical Data Links for Workstations and Midrange Computers*, 43rd Electronic Components and Technology Conference 1993 Proceedings, pp. 505-509, Jun. 1993.

Agilent Technologies, et al., *Small Form-factor Pluggable (SFP) Transceiver MultiSource Agreement (MSA), Cooperation Agreement for Small Form-Factor Pluggable Transceivers*, pp. 1-38, Sep. 14, 2000.

Ali Ghiasi, *XFP (10 Gigabit Small Form Factor Pluggable Module)*, Revision 0.92, Jul. 19, 2002.

US 6,554,622, 04/2003, Engel et al. (withdrawn)

* cited by examiner

MODULAR CAGE WITH HEAT SINK FOR USE WITH PLUGGABLE MODULE

RELATED APPLICATION

This application claims the benefit of U.S. Provisional Patent Application Ser. No. 60/379,436, filed May 9, 2002 and U.S. Provisional Patent Application Ser. No. 60/425,643, filed Nov. 12, 2002, both of which are incorporated herein by reference.

BACKGROUND OF THE INVENTION

1. The Field of the Invention

This invention relates generally to the field of electrical connector systems for electrical components. In particular, embodiments of the present invention relate to a heat sink structure associated with a cage body that is adapted to receive low-profile, user-removable, electronic modules that interface with a port of a host device.

2. The Related Technology

Fiber optics are increasingly used for transmitting voice and data signals. As a transmission medium, light provides a number of advantages over traditional electrical communication techniques. For example, light signals allow for extremely high transmission rates and very high bandwidth capabilities. Also, light signals are resistant to electromagnetic interferences that would otherwise interfere with electrical signals. Light signals also provides a more secure signal because it does not allow portions of the signal to escape from the fiber optic cable as can occur with electrical signals in wire-based systems. Light signals also can be conducted over greater distances without the signal loss typically associated with electrical signals on copper wire.

While optical communications provide a number of advantages, the use of light as a transmission medium presents a number of implementation challenges. In particular, the data carried by light signal must be converted to an electrical format when received by a device, such as a network switch. Conversely, when data is transmitted to the optical network, it must be converted from an electronic signal to a light signal. Transmission of optical signals are typically implemented using a transceiver module at both ends of a fiber optic cable. Each transceiver module typically contains a laser transmitter circuit capable of converting electrical signals to optical signals, and an optical receiver capable of converting received optical signals back into electrical signals.

Typically, a transceiver module is electrically interfaced with a host device, such as a host computer, switching hub, network router, switch box, computer I/O and the like, via a compatible connection port. Moreover, in some applications it is desirable to miniaturize the physical size of the transceiver module to increase the port density, and therefore accommodate a higher number of network connections within a given physical space. In addition, in many applications, it is desirable for the module to be hot-pluggable, which permits the module to be inserted and removed from the host system without interrupting electrical power. To accomplish many of these objectives, international and industry standards have been adopted that define the physical size and shape of optical transceiver modules to insure compatibility between different manufacturers. For example, in 1998, a group of optical manufacturers developed a set of standards for optical transceiver modules called the Small Form-factor Pluggable Transceiver MultiSource Agreement (SFP Transceiver MSA). In addition to the details of the electrical interface, this standard defines the physical size and shape for the SFP transceiver modules, and the corresponding module cage that is mounted on a printed circuit board at the host and receives the transceiver modules, so as to insure interoperability between different manufacturers' products.

As the protocols used in optical networks increase in native transmission speed, the heat generated by the transceivers typically increases. For instance, 10-Gigabit transceivers generally require heat dissipation mechanisms, whereas transceivers used with optical transmission of lower speeds may not require heat dissipation. The use of heat dissipation mechanisms, however, increases the complexity and cost of the transceiver/cage assembly and reduces the space that would otherwise be available for the functional optical and electrical components of the assembly.

In addition, it is desirable to obtain module cages that have a substantially planar top surface that permits a flat rock tool to be used to mount the cages to printed circuit boards. Specifically, when a component has a substantially planar top surface and has pins that are aligned with corresponding holes in the surface of a printed circuit board, a flat rock tool can be used to press the pins of the component into the corresponding holes. In contrast, components that are not planar or otherwise have irregular top surfaces are mounted to printed circuit boards using dies that are formed to correspond to the shape of the top surface. The use of such specialized dies is expensive and cumbersome compared with the relatively simple flat rock tools that can be used with components having planar top surfaces.

SUMMARY OF THE INVENTION

The present invention relates to an assembly that includes a heat sink connected with the body of a module cage that is adapted to receive an electronics component or module, such as an optical transceiver module. The invention also extends to leaf springs or other such structures formed on a bottom wall of the module cage opposite the position of the heat sink. The assembly can be used with electronic modules that generate heat that is to be dissipated in order to enable the modules to operate or to optimize the operation or heat properties of the module or of the opto-electrical systems in which the assemblies and modules are implemented.

One advantage of the heat sink and module cage assemblies of the invention is that they can be assembled by the manufacturer, meaning that the heat sink is attached to the body of the module cage. This assembly can occur prior to delivery of the cage to the user, which eliminates the need for the user to attach a separate heat sink to a module cage to dissipate heat from a pluggable module.

Attaching the heat sink to the module cage, as opposed to placing the heat sink at some other location that could also dissipate heat from the pluggable module, has several advantages. Using the heat sink as one of the sidewalls provides the benefit of preserving the space within the module cage for the pluggable module and its optical and electrical components.

The leaf springs or other analogous structures formed on the bottom wall of the module cage exert a force against a pluggable module that has been received by the module cage. This force biases the top surface of the pluggable module against the heat sink that is attached to the module cage. Using leaf springs integrally formed in the module cage in this manner is an improvement over other techniques for dissipating heat from a pluggable module, some of which use detachable heat sinks that require an external structure to press the heat sink against the module cage and against the pluggable module.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

The appended drawings contain figures of a preferred embodiment of the present invention. The above-mentioned features of the invention, as well as other features, will be described in connection with the preferred embodiment. However, the illustrated embodiment is only intended to illustrate the invention and not limit the invention. The drawings contain the following figures.

DETAILED DESCRIPTION OF PREFERRED EMBODIMENTS

Reference will now be made to the drawings to describe the invention. It is to be understood that the drawings are diagrammatic and schematic representations of presently preferred embodiments, and are not limiting of the present invention, nor are they necessarily drawn to scale.

In general, the present invention relates to an assembly that includes a heat sink connected with the body of a module cage that is adapted to receive an component module, such as an optical transceiver module. As used herein, the term "electronic module" and "electronics component" are interchangeable and refer to the pluggable modules that are received by the module cage, examples of which include the opto-electronic transceiver modules disclosed herein. The invention also extends to leaf springs or other such structures formed on a bottom wall of the module cage opposite the position of the heat sink. The assembly can be used with electronic modules that generate heat that is to be dissipated in order to enable the modules to operate or to optimize the operation or heat properties of the module or of the opto-electrical systems in which the assemblies and modules are implemented.

One advantage of the heat sink and module cage assemblies of the invention is that they can be assembled by the manufacturer, meaning that the heat sink is attached to the body of the module cage. This assembly can occur prior to delivery of the cage to the user, which eliminates the need for the user to attach a separate heat sink to a module cage to dissipate heat from a pluggable module.

While the invention is describe herein primarily in the context of 10 Gigabit transceiver modules, the general principles of the invention can be used with transceiver modules with other data rates, as well as transceiver modules that generate more or less heat than 10 Gigabit transceiver modules. Moreover, the module cages having heat sinks and the spring mechanisms for biasing the pluggable component against the heat sinks according to the invention can be used in combination with pluggable components other than the transceiver modules described herein.

Compared with transceiver modules with relatively slow data rates, such as 1 Gigabit or 2.5 Gigabit, transceiver modules for 10 Gigabit optical networks generate a significant amount of heat. For instance, each 10 Gigabit Ethernet transceiver module typically operates at 2.5 Watts or higher. This level of power requires the use of structures, such as heat sinks, for dissipating heat. This is particularly important when the transceiver modules are used in relatively enclosed or small environments, or when multiple transceiver modules are used in a single board. Some printed circuit boards can have as many as sixteen or more module cages for receiving 10 Gigabit transceiver modules.

Another limiting factor in the design of heat sinks for use with pluggable transceiver modules is the size constraints associated with PCI cards, which are cards that comply with the Peripheral Component Interconnect (PCI) standard. While the invention is not limited to PCI cards, the widespread use of PCI cards is such that designs that are not compatible with PCI cards may not be well received by consumers. In general, the pitch of a series of PCI slots constrains the height of the PCI card components to 0.57 inches, wherein the height is defined to be in the direction of the pitch of the PCI slots. The heat sink and module cage assemblies of the invention can have substantially any dimensions that are necessary for compatibility with the corresponding electronics components and to adequately dissipate heat from the electronics components. However, for electronics components that are compatible for use with PCI cards, it has been found that the heat sink and module cage assemblies can be constructed so as to have a height dimension that is no greater than about 0.57 inches, which enables the assemblies to be used with PCI cards. Moreover, the heat sink assemblies can be used with transceiver modules having a low profile, and without violating existing industry standards, such as those specified in the SFP Transceiver MSA.

In addition to the small form factor and profile considerations described above, the components of the heat sink and module cage assembly preferably have dimensions that allow convenient insertion and extraction of a single pluggable electronic module without disturbing adjacent modules or adjacent fiber cables, even when used in a host having a high port density. Also, in a preferred embodiment, the assembly is constructed so as to preclude inadvertent extraction of the electronics module from the chamber of the assembly.

Attaching the heat sink to the module cage, as opposed to placing the heat sink at some other location that could also dissipate heat from the pluggable module, has several advantages. Using the heat sink as one of the sidewalls provides the benefit of preserving the space within the module cage for the pluggable module and its optical and electrical components.

Figure 1:
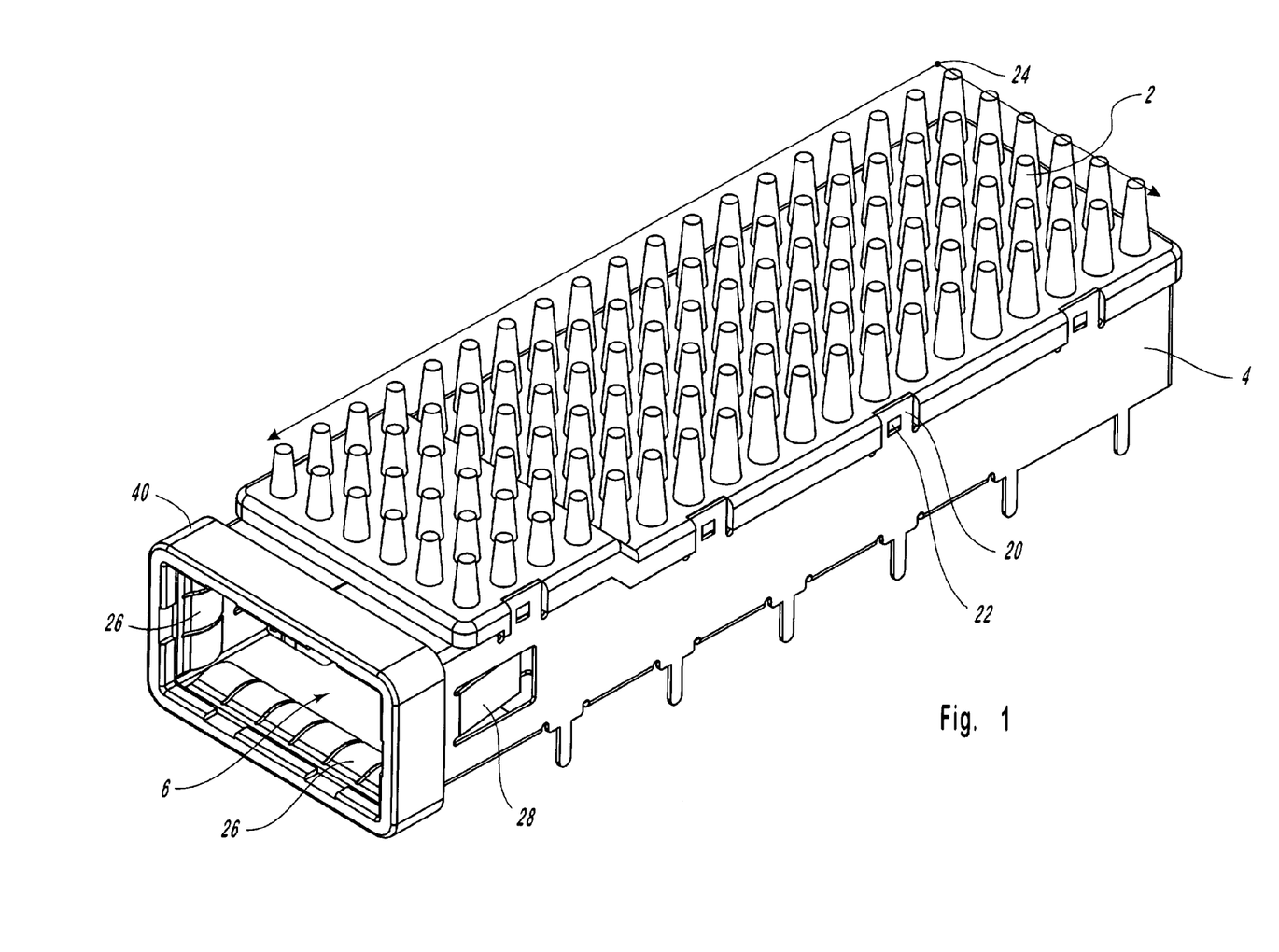
FIG. 1 is a perspective view of a heat sink and module cage assembly.

FIG. 1 is a perspective view of a heat sink and module cage assembly according to one embodiment of the invention. The assembly of FIG. 1 includes a heat sink 2 attached to a cage body, or module cage 4. Module cage 4 has a sleeve 40 that defines an opening 6 of a chamber configured to receive a pluggable electronic module or electronics component, such as the opto-electronic transceiver module illustrated in FIG. 5. The chamber formed by heat sink 2 and module cage 4 receives the pluggable electronic module so as to dissipate heat generated by the electronic module and to secure the electronic module in a position such that it can be in electrical communication with other components in its environment.

As shown in FIG. 1, heat sink 2 forms one of the four sidewalls of the module cage assembly, with the other three of the four sidewalls being provided by module cage 4. Moreover, heat sink 2 operates to tie the stamped module cage 4 together, thereby providing structural stability and enabling the stamped module cage 4 to be fabricated in a relatively simple process. In particular, the heat sink is attached to two opposite, lateral sidewalls of the module cage, thereby mechanically tying the two lateral sidewalls in substantially fixed positions with respect to one another.

Figure 4:
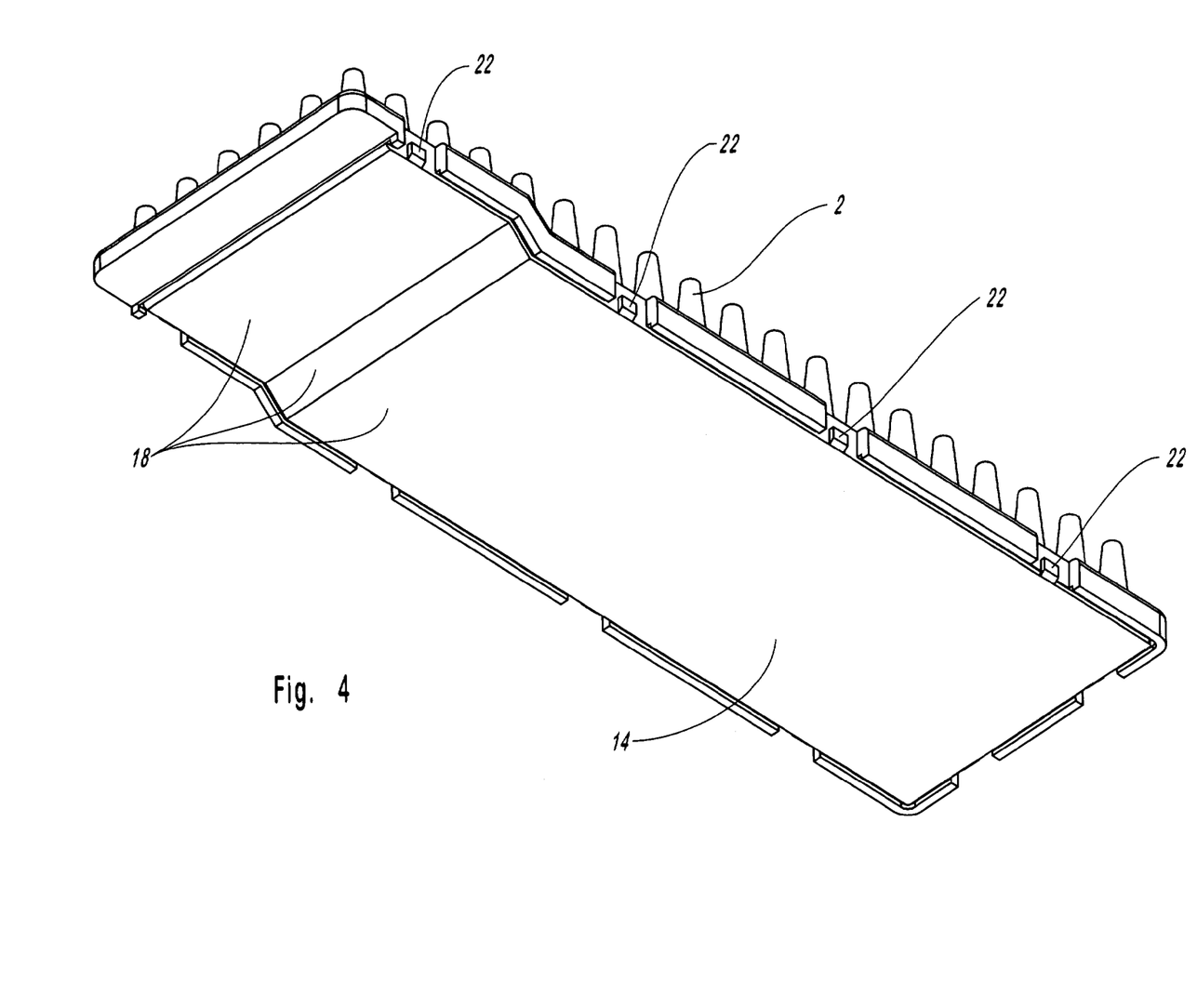
FIG. 4 is a perspective view of the heat sink of FIGS. 1 and 2 before being assembled with the module cage.
Figure 5:
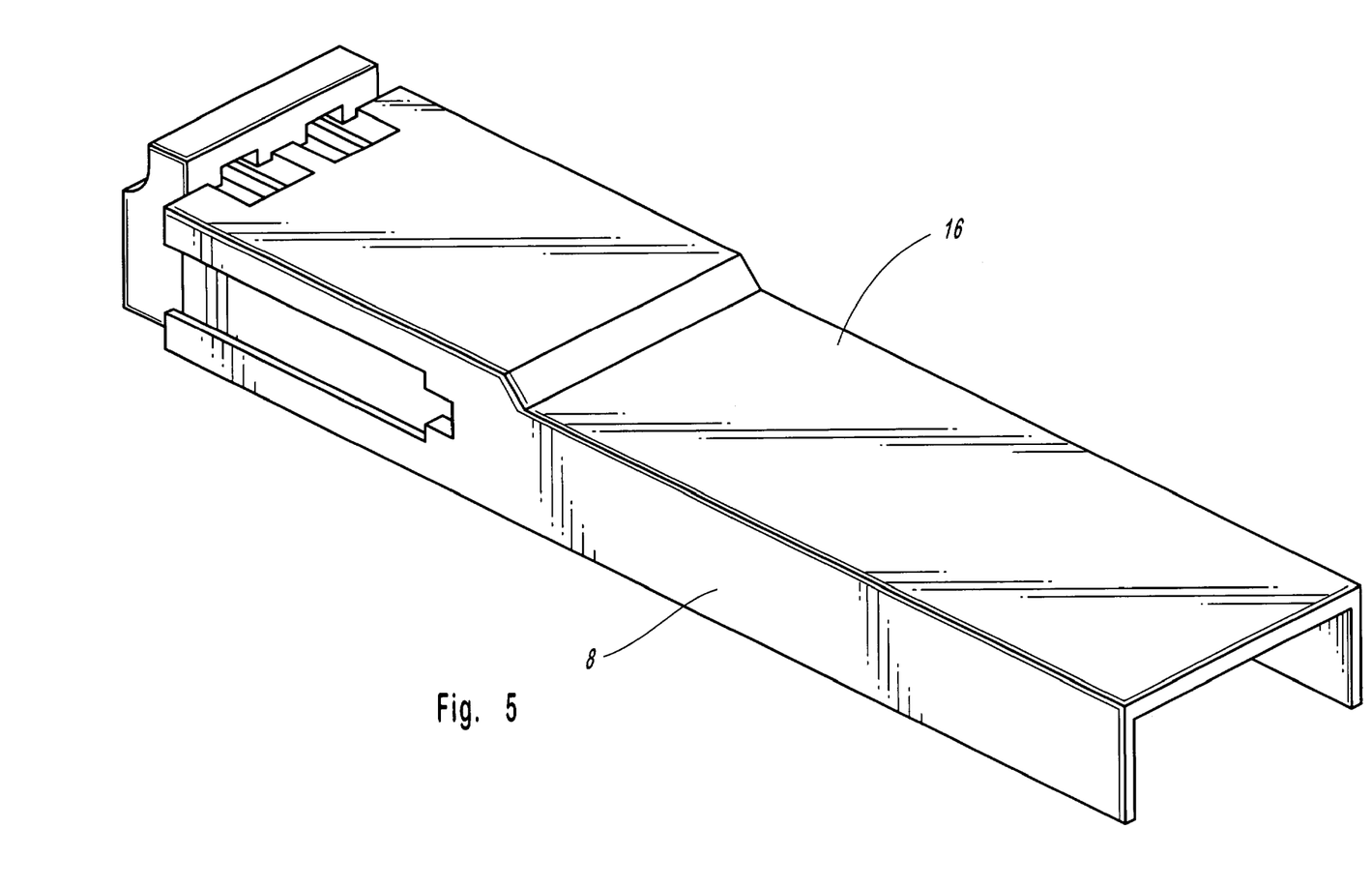
FIG. 5 is a perspective view of one example of a pluggable module that can be received by the heat sink and module cage assembly.

As illustrated in FIG. 4, heat sink 2 has a substantially smooth bottom surface 14 that is adapted for contact with the corresponding smooth top surface 16 of the pluggable electronic module 8 illustrated in FIG. 5. The smooth surfaces of the heat sink 2 and the pluggable electronic module 8 facilitate contact between the heat sink and the electronic module, which enhances the conductivity of the interface there between. The opposite surface of heat sink 2 that is in contact with the atmosphere can have a set of fins or other structures that are known in the art for increasing the effective surface area of the heat sink and to thereby enhance the conductive and convective transfer of heat into the atmosphere. Depending on the heat dissipation requirements, heat sink 2 can have either a step configuration 18, as shown in FIG. 4, or can a substantially uniform cross sectional area along its length. The factors that determine whether a step configuration 18 is to be used include the tradeoff between the volume of the heat sink 2 and the volume of the pluggable electronic module 18 that can be received by the module cage assembly.

Figure 2:
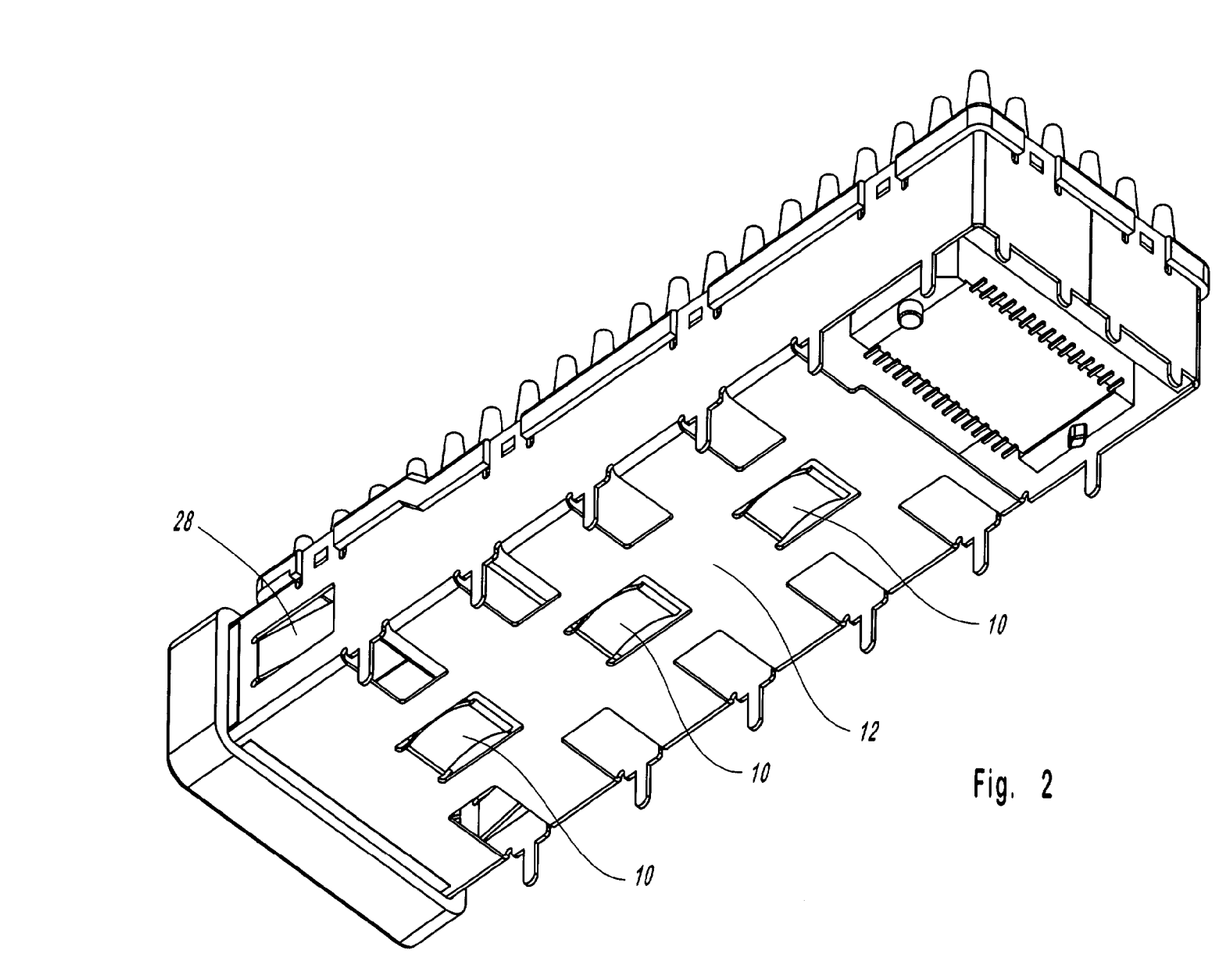
FIG. 2 is a perspective view of a heat sink and module cage assembly.
Figure 3:
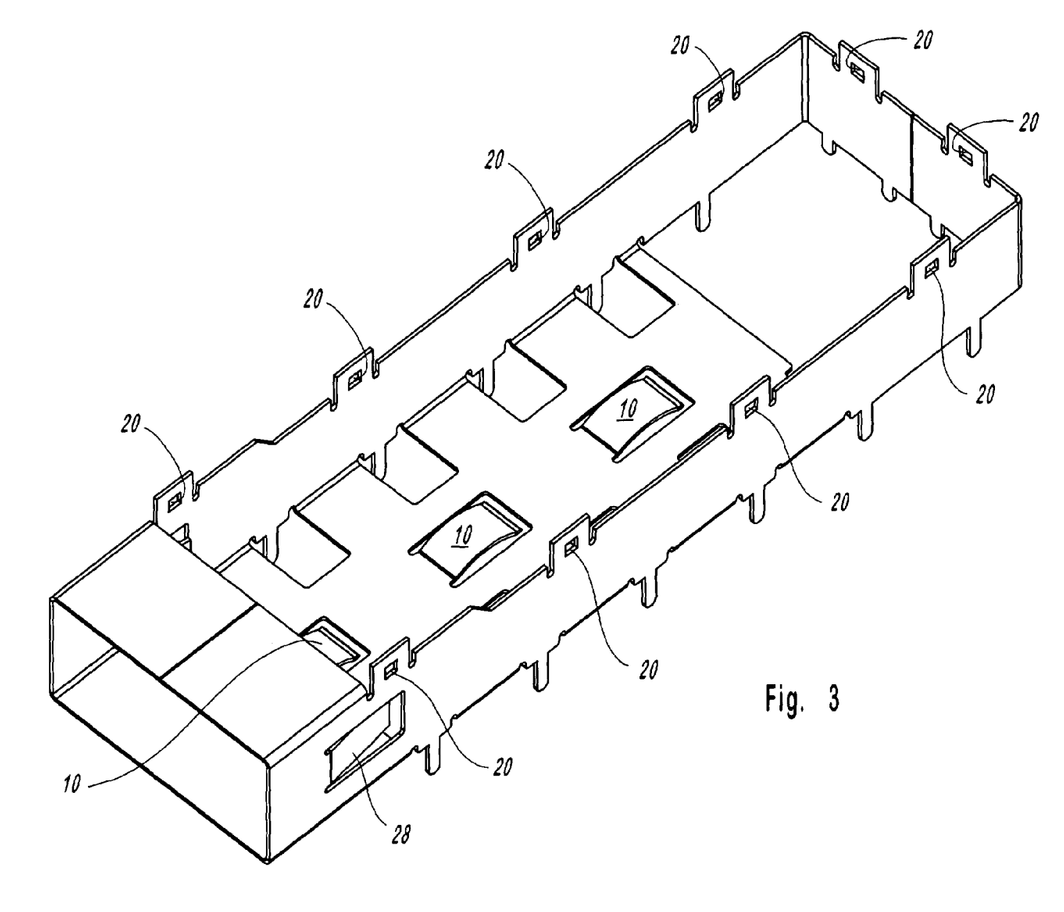
FIG. 3 is a perspective view of the module cage of FIGS. 1 and 2 before being assembled with the heat sink.

As shown in FIGS. 2 and 3, in order to facilitate full contact between the top surface of the electronic module 8 and the bottom surface 14 of heat sink 2, the bottom side wall 12 of module cage 4 includes one or more leaf springs 10 or other spring mechanisms to apply to the electronic module 8 that biases the electronic module against the heat sink 2. In this manner, electronic module 8, when received by the module cage 4, is positioned in close contact with heat sink 2 rather than residing loosely within the module cage assembly. In particular, when an electronic module 8 is received in the chamber of a module cage assembly, the leaf springs 10 and the electronic module 8 mechanically interfere with one another, such that the leaf springs 10 are displaced away from the chamber of the module cage assembly. This displacement of the leaf springs 10 cause the leaf springs to exert a counteracting force against the electronic module 8 in the chamber of the module cage assembly. In turn, this force biases the electronic module 8 against bottom surface 14 of the heat sink 2, which is positioned at the top side wall of the module cage assembly opposite bottom side wall 12.

FIGS. 2 and 3 illustrate three leaf springs 10 formed in the bottom side wall 12 of module cage 4. However, the number of leaf springs and the specific configuration thereof can differ from that illustrated in FIGS. 2 and 3. In general, the leaf springs or other spring mechanisms that apply the force to the electronic module in the manner described above in reference to FIGS. 2 and 3 are selected so as to be relatively easily fabricated and to efficiently produce a force against the electronic module, while substantially not interfering the ability to insert and remove the electronic module from the module cage assembly. It is also noted that the leaf springs 10 of FIGS. 2 and 3 are integrally formed with module cage 4, which significantly simplifies the structure that facilitates contact between the pluggable electronic component 8 and the heat sink 2. Leaf springs 10 and other leaf springs or spring mechanisms that provide the functions described herein represent examples of means for biasing the electronic component against the heat sink.

While various structures for connecting the heat sink 2 with the module cage 4 can be used, FIGS. 3-4 show that a set of structures for snap fitting the heat sink 2 to the module cage 4 provide a structure that can be assembled during the fabrication process, thereby eliminating the need for the user of the module cage 4 to attach a heat sink 2 thereto. As used herein, the term "fabrication process" refers to the process of assembling the heat sink and module cage assembly prior to the assembly being received by a user or consumer. For instance, the fabrication process in which the heat sink is assembled with the module cage can be performed prior to shipping the assembly to the manufacturer of network or communications equipment in which the assembly is to be installed. FIG. 3 shows a set of holes 20 on the cage body 4 adapted for receipt of a corresponding set of pins 22 residing on the heat sink 2, as shown in FIG. 4. When the heat sink 2 is assembled with the module cage 4, the means for connecting the heat sink 2 with the module cage 4 is sufficiently secure that it does not require later manipulation by the user, nor will the heat sink 2 become unintentionally detached from the remainder of the assembly.

The module cage 4 can be compatible with or can exhibit desirable electromagnetic interference shielding properties. For instance, as illustrated in FIG. 1, sleeve 40 includes a set of conductive fingers 26 that engage the surface of the pluggable electronic module 8 so as to reduce electromagnetic radiation and the associated interference from the module cage assembly. Moreover, the use of the heat sink 2 as one of the four sidewalls facilitates the insertion and removal of the pluggable electronic modules 8 and simplifies the fabrication process. The heat sinks 2 can have various heights, depending on the heat dissipation properties that are required, as well as the space constraints of the module cage 4 and the associated components of the host system.

As shown in FIG. 1, the heat sink 2 defines a top plane 24 that is compatible with the use of flat rock tools to mount the heat sink 2 and module cage 4 assembly to a printed circuit board, which avoids the need to use specialized dies formed specifically for the assembly.

As shown in FIGS. 1-3, the module cage 4 has leaf springs 28 or other biasing means formed in or on the left and right sidewalls wall near sleeve 40. The leaf springs 28 apply a force to the electronic module 8 that biases the electronic module 8 centrally within the assembly. This facilitates insertion and removal of the electronic module 8 and ensures that the electronic module remains sufficiently secure within the module cage assembly and is optimally positioned for establishing electrical contact with other electronic components of the system in which it is used.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An assembly for receiving an electronics component, comprising:
   a cage body substantially forming three of four sidewalls of the assembly, the three sidewalls including two lateral sidewalls having a set of holes; and
   a heat sink having a bottom surface substantially forming a fourth of the four sidewalls, the heat sink having a set of pins that engage with the set of holes to connect the cage body with the heat sink; and
   a sleeve at one end of the assembly forming an opening for accessing a chamber for receiving an electronics component, the chamber being formed by the four sidewalls of the assembly.

2. An assembly as recited in claim 1, wherein the cage body is stamped, and wherein the heat sink is attached to two lateral sidewalls formed by the cage body such that the two lateral sidewalls of the cage body are structurally fixed with respect to each other.

3. An assembly as recited in claim 1, wherein the heat sink has a top surface that substantially defines a plane.

4. An assembly as recited in claim 3, wherein the plane is configured such that a flat rock tool can be used to attach the assembly to a printed circuit board.

5. An assembly as recited in claim 1, wherein said heat sink is snap fitted to said cage body during a fabrication process.

6. An assembly as recited in claim 1, wherein one of the three sidewalls of the cage body opposite the bottom surface of the heat sink includes one or more leaf springs that are displaced from the chamber when the chamber receives said electronics component.

7. An assembly as recited in claim 1, wherein the assembly has a height dimension no greater than about 57 inches, such that the assembly is compatible with use in a PCI card.

8. The assembly as recited in claim 1, wherein the assembly is configured to removably receive a 10 Gb/s transceiver module.

9. The assembly as recited in claim 1, wherein the assembly is substantially compliant with the SFP MSA.

10. The assembly as recited in claim 1, wherein the assembly is configured to removably receive a PCI card.

11. An assembly for receiving an electronics component, comprising:
    a cage body having means for biasing formed in a bottom sidewall of the cage body that, when the assembly receives the pluggable electronics component, applies a force to the pluggable electronics component that biases the pluggable electronics component against a heat sink that is disposed in the assembly opposite the bottom sidewall; and
    a sleeve at one end of the assembly forming an opening for accessing a chamber positioned to receive said electronics component as said electronics component is plugged into the assembly, the cage body forming the bottom sidewall of the chamber.

12. An assembly as defined in claim 11, wherein the electronic component is an opto-electronic transceiver.

13. An assembly as defined in claim 11, wherein the biasing means comprises one or more leaf springs.

14. An assembly as recited in claim 11, wherein:
    the cage body substantially forms three of four sidewalls, including the bottom sidewall; and
    the assembly further comprises the heat sink, wherein the heat sink has a bottom surface substantially forming a fourth of the four sidewalls.

15. An assembly as recited in claim 14, wherein the heat sink is attached to the cage body prior to said assembly being mounted on a printed circuit board.

16. An assembly as recited in claim 14, wherein said heat sink is snap fitted to said cage body.

17. An assembly as recited in claim 16, wherein said heat sink has pins that match holes in said cage body that facilitate said heat sink being snap fitted to said cage body.

18. An assembly as recited in claim 16, wherein said heat sink is snap fitted to said cage body during a fabrication process.

19. An assembly as recited in claim 14, wherein the heat sink further comprises a substantially smooth surface for contact with the electronics component.

20. An assembly as recited in claim 19, wherein the substantially smooth surface of the heat sink has a stepped configuration along its length.

21. An assembly as recited in claim 19, wherein the heat sink has a substantially uniform cross-sectional area along its length.

22. An assembly as recited in claim 11, wherein the opening of the assembly is defined by a sleeve having conductive fingers that provide electromagnetic interference shielding.

23. An assembly as recited in claim 14, wherein said assembly is attached to a printed circuit board.

24. An assembly as recited in claim 23, wherein the heat sink has a top surface that substantially defines a plane such that the heat sink can be attached to the printed circuit board using a flat rock tool.

* * * * *